(12) United States Patent
Singh

(10) Patent No.: US 9,121,913 B2
(45) Date of Patent: Sep. 1, 2015

(54) SYSTEM FOR DETECTING A FAILURE ASSOCIATED WITH AN INVERTER OR ASSOCIATED MACHINE

(75) Inventor: Brij N. Singh, West Fargo, ND (US)

(73) Assignee: Deere & Company, Moline, IL (US)

( * ) Notice: Subject to any disclaimer, the term of this patent is extended or adjusted under 35 U.S.C. 154(b) by 1057 days.

(21) Appl. No.: 13/194,279

(22) Filed: Jul. 29, 2011

(65) Prior Publication Data

US 2012/0242365 A1    Sep. 27, 2012

Related U.S. Application Data

(60) Provisional application No. 61/454,690, filed on Mar. 21, 2011.

(51) Int. Cl.
*G01R 31/34* (2006.01)
*G01R 31/42* (2006.01)
*G01R 31/02* (2006.01)
*H02P 29/02* (2006.01)

(52) U.S. Cl.
CPC .............. *G01R 31/42* (2013.01); *G01R 31/343* (2013.01); *G01R 31/02* (2013.01); *H02P 29/02* (2013.01)

(58) Field of Classification Search
CPC ................ G01R 31/024–31/025; G01R 31/42; B60L 15/007; B60L 3/0023
See application file for complete search history.

(56) References Cited

U.S. PATENT DOCUMENTS

| 4,314,193 A | 2/1982 | Mortonson |
| 4,475,150 A | 10/1984 | D'Atre et al. |
| 4,511,835 A | 4/1985 | Studtmann |
| 4,540,922 A | 9/1985 | Horvath et al. |
| 5,914,582 A | 6/1999 | Takamoto et al. |
| 5,982,136 A | 11/1999 | Pelly |
| 6,331,941 B1 | 12/2001 | Smith |
| 7,782,115 B2 | 8/2010 | Ochi |
| 7,834,573 B2 | 11/2010 | Lindsey et al. |
| 2006/0237058 A1 | 10/2006 | McClintock et al. |
| 2006/0247829 A1 | 11/2006 | Sato |
| 2009/0284999 A1 | 11/2009 | Gibbs et al. |
| 2010/0060222 A1 | 3/2010 | Kezobo et al. |
| 2010/0169030 A1 | 7/2010 | Parlos |
| 2010/0320953 A1 | 12/2010 | Yeh et al. |
| 2011/0025369 A1 | 2/2011 | Quarto |

OTHER PUBLICATIONS

European Search Report issued in counterpart application No. 12760714.1, dated Sep. 25, 2014 (7 pages).

(Continued)

*Primary Examiner* — Mischita Henson

(57) ABSTRACT

An inverter comprises a first pair of semiconductor devices with switched terminals that are coupled in series between a positive terminal and a negative terminal of a direct current bus. An analog interface adjusts a voltage levels at measurement nodes associated with control terminals of the semiconductor devices. An analog-to-digital converter has analog inputs for receiving the adjusted voltage levels of the measurement nodes and outputting corresponding digital count data for each measurement node. A data processor is adapted to detect the fault or absence of a fault in the inverter based on the conformity of the digital count to one or more reference ranges stored in a data storage device for corresponding switch states of the semiconductor devices.

19 Claims, 2 Drawing Sheets

(56) References Cited

OTHER PUBLICATIONS

Fuchs, Some Diagnosis Methods for Voltage Source Inverters in Variable Speed Drives with Induction Machines A Survey (2003), Article [online], [retrieved on Jun. 29, 2012]. Retrieved from the Internet <URL: http://www.tf.uni-kiel.de/stit/LEA/dl-open/iecon2003-diagnosis.pdf>.
The International Search Report and the Written Opinion of the Internatonal Searching Authority, dated Jul. 11, 2012 (9 pages).

US 9,121,913 B2

SYSTEM FOR DETECTING A FAILURE ASSOCIATED WITH AN INVERTER OR ASSOCIATED MACHINE

This document claims priority based on U.S. provisional application Ser. No. 61/454,690, filed on 21 Mar. 2011 and entitled SYSTEM FOR DETECTING A FAILURE ASSOCIATED WITH AN INVERTER OR ASSOCIATED MACHINE, under 35 U.S.C. 119(e).

FIELD OF THE INVENTION

This invention relates to system for detecting or diagnosing a failure associated with an inverter or a machine associated with the inverter.

BACKGROUND

In the prior art, an inverter is used to convert a direct current (DC) voltage on a direct current data bus to one or more alternating current signals that control an electric motor. Conversely, an inverter may be used to convert generated alternating current from a machine (e.g., alternator or generator) into direct current for operating a vehicle or other electric equipment. In certain prior art configurations, the inverter comprises one or more power switching semiconductors that may fail in an open state or a closed state.

Certain prior art systems may attempt to detect a failure of the inverter or machine as part of a start-up diagnostic procedure at low power prior to operating the inverter or machine at full power in a fully operational mode. For example, certain prior art systems have a diagnostic procedure cycle that is executed at a lower voltage than operational voltage of the inverter each time an inverter or machine is started up or powered on. However, such prior art systems are not capable of detecting a failure during operation (or an operational period) of the inverter or machine between a previous diagnostic procedure cycle and the next diagnostic procedure cycle. Thus, there is a need for a system for providing real-time detection of failures of the inverter or machine during operation of the inverter or the machine.

SUMMARY OF THE INVENTION

In accordance with one embodiment, a system is capable of detecting a fault associated with an inverter or a machine associated with the inverter. The system comprises a direct current bus having a positive terminal and a negative terminal. An inverter comprises a first pair of semiconductor devices with switched terminals that are coupled in series between the positive terminal and the negative terminal of the direct current bus. An analog interface adjusts a voltage levels at measurement nodes associated with control terminals of the semiconductor devices. An analog-to-digital converter has analog inputs for receiving the adjusted voltage levels of the measurement nodes and outputting corresponding digital count data for each measurement node. A data processor is adapted to detect the fault in the inverter if the digital count data does not conform to one or more reference ranges stored in a data storage device for corresponding switch states of the semiconductor devices. Conversely, the data processor is adapted to detect the absence of fault in the inverter if the digital data count conforms to one or more reference ranges stored in the data storage device for corresponding switch states of the semiconductor devices.

DESCRIPTION OF THE PREFERRED EMBODIMENT

Figure 1:
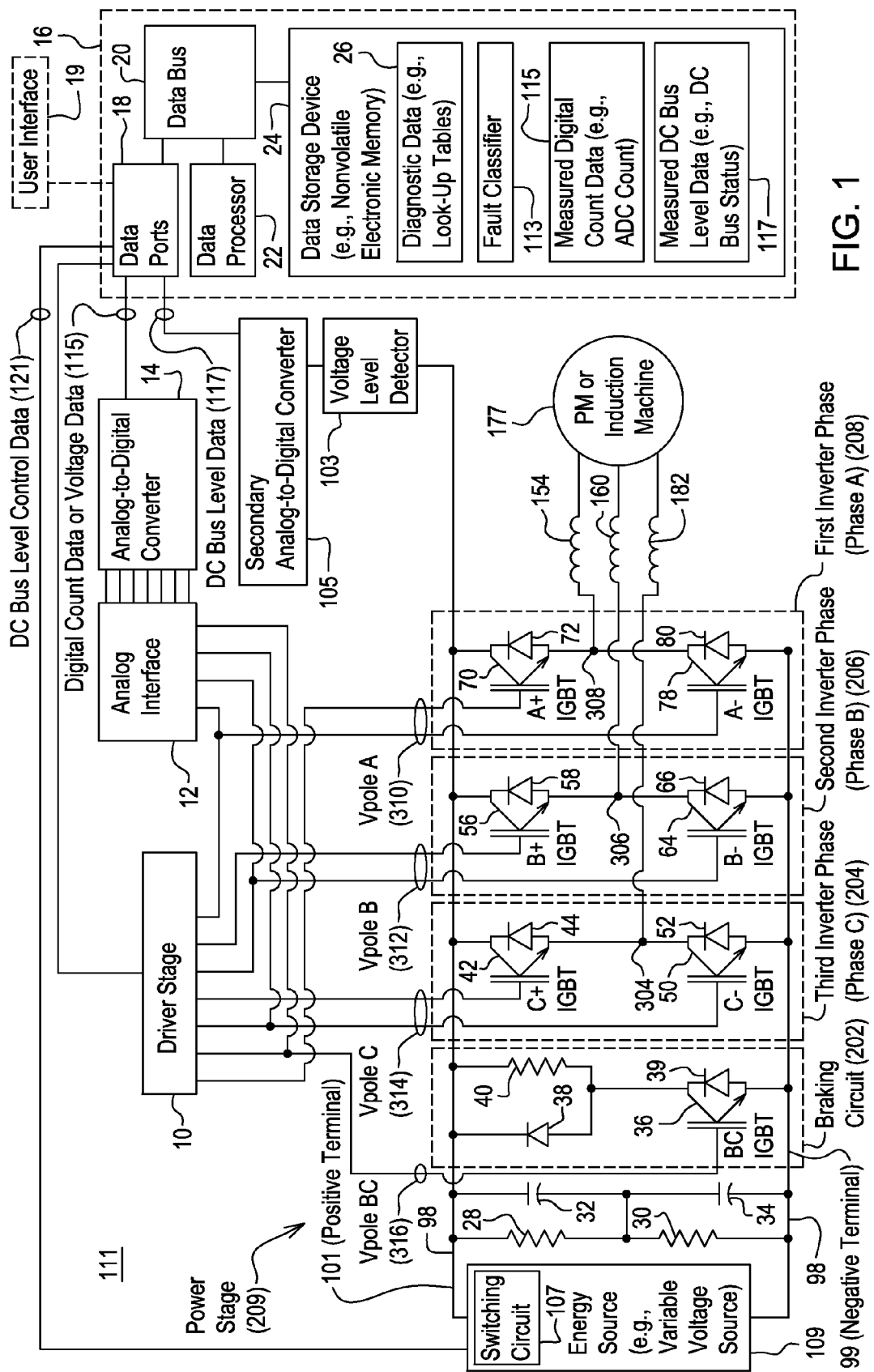
FIG. 1 is a block diagram of one embodiment of a system for detecting or diagnosing a failure associated with an inverter or a machine associated with the inverter.

In accordance with one embodiment, FIG. 1 shows a system 111 that is capable of detecting or diagnosing a failure associated with an inverter or a machine 177 associated with the inverter. The system 111 is well suited for diagnosing, identifying and classifying a failure of the inverter (e.g., power stage 209) in real-time or during an operational mode of the inverter, as opposed to a pre-test non-operational mode. In the operational mode, the inverter (e.g., power stage 209) is capable of converting direct current into one or more alternating current signals for application to a machine 177 or motor for control of the machine 177 or motor. In the test mode, the inverter does not provide or output one or more alternating current signals for application to a machine 177 or motor.

In one embodiment, the system 111 comprises an energy source 109 (e.g., a battery, fuel cell or mechanically driven generator) that provides electrical energy or direct current voltage for a direct current bus 98. The direct current bus 98 has a positive terminal 101 and a negative terminal 99. The inverter (e.g., power stage 209) may have one or more inverter phases (208, 206, and 204) or switching sections, where each phase (208, 206 or 204) or switching section provides a separate output signal to a corresponding output terminal (304, 306, 308) of the inverter. In one embodiment, each phase (208, 206 or 204) of the inverter has a pair of switching transistors. The switching transistors are configured to receive direct current power from the direct current bus 98. For example, each phase of the inverter power stage 209 comprises a first pair of semiconductor devices (e.g., 70, 78 for first inverter phase 208) with switched terminals (e.g., collector and emitter, or drain and source) that are coupled in series between the positive terminal 101 and the negative terminal 99 of the direct current bus 98. One or more output terminals of the inverter are coupled to the load machine 177 (e.g., motor).

A driver stage 10 is coupled to the switching transistors (e.g., 70, 78 for first inverter phase 208) to control of the switching transistors based on command data of the electronic data processing system 16. The electronic data processing system 16 may be connected to a vehicle data bus (not shown) via one of the data ports 18. The vehicle data bus may comprise an ISO (International Standards Organization) compatible data bus or a controller area network (CAN) data bus for the communication of data messages with one or more controllers, input devices, or user interfaces for accepting operator input (e.g., user-inputted speed or torque command for the motor), for example. The driver stage 10 controls the switching transistors to modulate the output signal applied to the machine 177 or motor, which supports the control of the rotational speed, torque, acceleration, deceleration, or rotational direction of the motor or machine 177.

An analog interface 12 is coupled to control terminals of the semiconductor devices (bases or gates of the semiconductor devices 36, 42, 50, 56, 64, 70, and 78). For example, an analog interface 12 adjusts, averages or scales a voltage levels at measurement nodes (310, 312, 314) associated with control terminals of the semiconductor devices. In the illustrative example of FIG. 1, the measurement nodes comprise a first measurement node 310 for the first inverter phase 208, a second measurement node 312 for the second inverter phase 206, a third measurement node 314 for the third inverter phase 204, and a fourth measurement node 316 for the braking circuit 202. In charts set forth in this document, the first measurement node 310, or its associated measured voltage with reference to the negative terminal 99 of the direct current bus 98, is referred to as Vpole_A; the second measurement node 312, or its associated measured voltage with reference to the negative terminal 99 of the direct current bus 98, is referred to as Vpole_B; the third measurement node 314, or its associated measured voltage with reference to the negative terminal 99 of the direct current bus 98, is referred to as Vpole_C, and the fourth measurement node 316 is referred to as Vpole_BC, or its associated measured voltage with reference to the negative terminal 99 of the direct current bus 98.

In one embodiment, the analog interface 12 comprises an analog-averaging circuit for determining an average voltage level on any measurement node, a mean voltage level, a median voltage level, or a root mean squared value on any measurement node. For example, any such voltage level on any measurement node may be measured with reference to the negative terminal 99 of the direct current bus 98. In one embodiment, the average voltage level represents the midpoint between a low voltage level and high voltage level at the evaluated measurement node during a sampling period or sampling interval that may be defined with reference to the frequency or period of the modulating signals (e.g., commanded signals) outputted by the driver stage 10 to the power stage 209. In another embodiment, the average voltage level may also represent one-half multiplied by the sum of the absolute value of a minimum low voltage level and the absolute value of a maximum high voltage level of the evaluated measurement node during the sampling period or sampling interval.

In other embodiments, the analog interface 12 may comprise a scaling amplifier, a compression amplifier, or an attenuating amplifier, or another circuit to adjust the signal level applied to the analog-to-digital converter 14 to an appropriate range of signal values for processing.

Inputs of one or more analog-to digital converters 14 are coupled to an output of the analog interface 12. An analog-to-digital converter 14 has analog inputs for receiving the adjusted voltage levels of the measurement nodes (310, 312, 314, 316) and outputting corresponding digital count data 115 (e.g., AOC count data in the charts disclosed in this document) or corresponding voltage data for each measurement node. In turn, the analog-to-digital converter 14 is coupled to the electronic data processing system 16, which may store the measured digital count data 115, which can also be referred to as stored digital count data.

In the data processing system 16, a data processor 22 is adapted to detect the fault in the inverter (e.g., power stage 209) if the digital count data 115 does not conform to one or more reference ranges (e.g. in the diagnostic data or look-up tables similar to charts set forth in this document) stored in a data storage device 24 for corresponding switch states of the semiconductor devices. Conversely, the data processor 22 is adapted to detect the absence of fault in the inverter (e.g., power stage 209) if the digital count data 115 conforms to one or more reference ranges stored in the data storage device 24 for corresponding switch states of the semiconductor devices. As used in this document, switch states indicate whether a properly functioning or unimpaired semiconductor device is active ("on" or "closed") or inactive ("off" or "open"). A failure of a semiconductor device to change states may result in a semiconductor device failing in an open state or a closed state, for example.

The electronic data processing system 16 may control voltage level output of the energy source 109, or a switching circuit 107 of the energy source 109 to control the voltage level output. Although the switching circuit 107 is shown in the block of the energy source 109, the switching circuit 107 can be: (1) separately packaged from a battery, a generator, or a fuel cell, or (2) connected as an intermediary between the energy source 109, the battery, the generator or fuel cell and the direct current bus 98, and such configurations fall within the scope of the claims attached to this document. The energy source 109 may have a first voltage level output and a second level output, where the second level output is greater than the first level output. In one embodiment, the first voltage level may comprise a test voltage range that is equal to or lower than 24 Volts Direct Current, whereas the second voltage level may comprise an operational voltage range that is equal to or greater than 48 Volts Direct Current. For example, the test voltage range is predominately used in the test mode for testing whether a short circuit exists prior to applying a full operational voltage range to a direct current bus 98.

In one embodiment, the energy source 109 is coupled (e.g., via the switching circuit 107) to the direct current bus 98. A switching circuit 107 is associated with the energy source 109 for adjusting a voltage level on the direct current bus 98 between a first voltage level and a second voltage level, or between a test voltage range and operational voltage range. The data processing system 16 is configured to control the switching circuit 107 to adjust the voltage level on the direct current bus 98 to a target voltage level. The target voltage levels may be consistent with diagnostic data 26 or software instructions of the fault classifier 113 in the data storage device 24.

A voltage level detector 103 is coupled to at least one terminal of the direct current bus 98. The voltage level detector 103 detects a voltage level (e.g., first voltage level, second voltage level, or measured DC bus level data 117) applied to the direct current bus 98 by the energy source 109. The voltage level detector 103 may feature voltage compression, voltage scaling, or other techniques for adjusting the voltage on the direct current bus 98 for measurement purposes and processing by the secondary analog-to-digital converter 105 or data processor 22.

In one embodiment, as illustrated in FIG. 1, the voltage level detector 103 may be coupled to a secondary analog-to-digital converter 105 for converting a detected voltage level to a corresponding high voltage level or a corresponding low voltage level, or otherwise setting the DC bus status. In turn, the output of the secondary analog-to-digital converter 105 is coupled to the data processing system 16.

One or more capacitors (32, 34) are connected across the terminals (99, 101) of the direct current bus 98. As shown, two resistors (28, 30) are connected in series between the positive terminal 101 and negative terminal 99 of the direct current bus 98. Each capacitor (32, 34) may comprise an electrolytic capacitor, or a capacitor bank for filtering the direct current and keeping the voltage or current on the direct current bus 98 at a substantially uniform level or within a desired range of fluctuation (e.g., within tolerance for acceptable current ripple). For example, each capacitor (32, 34) may reduce or ameliorate the fluctuation in the current of the direct current bus 98 that might otherwise occur when one or more semiconductor switches in the power stage 209 associated with one or more stages of the inverter are active or switched on simultaneously or in rapid succession.

In one embodiment, one or more resistors (28, 30) may be connected in series between the positive and negative terminal 99 of the direct current bus 98. Each resistor (28 or 30) may be connected in parallel with a corresponding capacitor (32 or 34, respectively) to form a filtering network (e.g., a resistive-capacitive (RC) filter), for example.

As previously noted, output nodes (304, 306, 308) of the inverter phases may be coupled to the corresponding motor phase terminals of the load, motor or machine 177. As illustrated in FIG. 1, the inverter power stage 209 has three phases and the load has three phases, although any number of phases could be used from a single phase to a multi-phase configuration. Although the inverter power stage 209 has three phases in FIG. 1, it is understood that the inverter or system 111 may have any number of phases from 1 to N, where N is a positive whole number. As shown, the inverter power stage 209 has a first inverter phase 208, a second inverter phase 206 and a third inverter phase 204. Further, the inverter power stage 209 has a braking circuit 202 for rectifying current produced by the machine 117 during its operation in a braking mode, as opposed to a motoring mode.

The first inverter phase 208 has a first switching section or first pair of semiconductor devices (70, 78). The second inverter phase 206 has a second switching section or a second pair of semiconductor devices (56, 64). The third inverter phase 204 has a third switching section or a third pair of semiconductor devices (42, 50). Each phase of the inverter power stage 209 comprises a first switching transistor (70, 56, 42) and a second switching transistor (78, 64, 50) with their respective switched terminals (e.g., collector and emitter, or source and drain) connected in series with respect to each other between the positive terminal 101 and the negative terminal 99. Although the first switching transistor (70, 56, 42) and the second switching transistor (78, 64, 50) are illustrated as NPN transistors, in an alternative embodiment the first switching transistor and the second switching transistor may comprise PNP transistors, field effect transistors, or other suitable semiconductor devices.

The first inverter phase 208 has inputs associated with the bases (or gates) of the first switching transistor (70) and the second switching transistor (78). In the charts set forth herein, the first switching transistor (70) of the first inverter phase 208 is referred to as A+ IGBT; the second switching transistor (78) of the first inverter phase 208 is referred to as A− IGBT. Although IGBT refers to an insulated gate bipolar transistor, in any phase of the power stage 209, the first switching transistor (e.g., 70) and the second switching transistor (e.g., 78) may comprise field effect transistors, complementary metal oxide semiconductors, power transistors, or other suitable semiconductor devices.

The first inverter phase 208 has a first output node 308 coupled to the load or a first winding 154 of the machine 177 (e.g., permanent magnet or induction machine). In an alternate embodiment, the first winding 154 may be replaced with or represent an inductor coupled between the machine 177 and the output node 308.

The second inverter phase 206 has inputs associated with the bases (or gates) of the first switching transistor (56) and the second switching transistor (64). In the charts set forth herein, the first switching transistor (56) of the second inverter phase 206 is referred to as B+ IGBT; the second switching transistor (64) of the second inverter phase 206 is referred to as B− IGBT. The second inverter phase 206 has a second output node 306 coupled to the machine 117 or a second winding 160 of the machine 117 (e.g., motor). In an alternate embodiment, the second winding 160 may be replaced with or represent an inductor coupled between the machine 177 and the output node 306.

The third inverter phase 204 has inputs associated with the bases (or gates) of the first switching transistor (42) and the second switching transistor (50). In the charts set forth herein, the first switching transistor (42) of the third inverter phase 204 is referred to as C+ IGBT; the second switching transistor (50) of the third inverter phase 204 is referred to as C− IGBT. The third inverter phase 204 has a third output node 182 coupled to the machine 117 or a third winding 182 of the machine 117 (e.g., motor). In an alternate embodiment, the third winding 182 may be replaced with or represent an inductor coupled between the machine 177 and the output node 304.

The base (or gate) of each first switching transistor (70, 56, 42) is coupled to the driver stage 10. The driver stage 10 comprises a biasing network or a logic circuit for providing a signal (e.g., modulating signal) to activate (e.g., switch on) and deactivate (e.g., switch off) the first switching transistor, subject to the control of the electronic data processing system 16. Similarly, the base (or gate) of the second switching transistor (78, 64, 50) is coupled to the driver stage 10 or the logic circuit for providing a signal to activate (e.g., switch on) and deactivate (e.g., switch off) the second switching transistor, subject to the control of the electronic data processing system 16.

As illustrated in FIG. 1, the collector of each first switching transistor (70, 56, 42) is coupled to one voltage rail or the positive terminal 101 of the direct current bus 98, whereas the emitter of the first switching transistor (70, 56, 42) is coupled to an output node of the respective phase. The collector of each second switching transistor (78, 64, 50) is coupled to the output node (308, 306, 304, respectively) of the respective phase, whereas the emitter of the second switching transistor (78, 64, 50) is coupled to another voltage rail (of the direct current bus 98) or the negative terminal 99 of the direct current bus 98.

A first protective diode (72, 58, 44) is connected in parallel between the collector and emitter of each first switching transistor (70, 56, 42). A second protective diode (80, 66, 52) is connected in parallel between the collector and emitter of each second switching transistor (80, 66, 52). The first protective diode (72, 58, 44) and the second protective diode (80, 66, 52) prevent transient currents from damaging the first switching transistor (70, 56, 42) and the second switching transistor (78, 64, 50), respectively, by providing a path for current to be dissipated when the first switching transistor or the second switching transistor is switched between states (e.g., or turned off).

The regenerative braking circuit 202 allows the inverter to function in a rectification mode and the motor or machine 177 to operate as a generator in a braking mode or power generation mode, as opposed to a motoring mode. To reduce the rotational energy of the machine 177 in a braking mode and to generate electrical energy from the rotational energy, the machine 177 is commanded to operate in a regenerative braking mode where the machine 177 generates alternating current energy for application to one or more of the output nodes (308, 306, 304) of the inverter power stage 209. The braking mode transistor 36 is in series with a parallel combination of a rectifying diode 38 and a resistor 40. The braking mode transistor 36 is operable to switch or direct current to the rectifying diode 38 to rectify the alternating current generated by the machine 177 or to convert the alternating current into direct current during appropriate waveform cycle portions of the generated alternating current. A protective diode 39 is connected between the emitter and collector of the braking mode transistor 36 to protect the transistor 36 from damaging currents that would otherwise occur. In the charts set forth in this document, the braking mode transistor 36 may be referred to as BC IGBT.

The electronic data processing system 16 comprises a data processor 22, a data storage device 24 and one or more data ports 18 coupled to a data bus 20. The data processor 22, the data storage device 24 and the data ports 18 are capable of communicating with one another via the data bus 20.

The data processor 22 may comprise a microprocessor, a microcontroller, a logic device, an arithmetic logic unit, an application specific integrated circuit, a programmable logic array, a field programmable gate array (FPGA), a digital signal processor (DSP), a programmable system on a chip (PSoC), or another programmable electronic device.

The data storage device 24 may comprise any electronic memory, random access memory, non-volatile memory, a magnetic storage device, an optical storage device, or any other suitable device or medium for storing data. Each data port 18 may comprise an input/output port, a transceiver, or another device for transmitting to, receiving from, or communicating with electronic devices via a transmission line or otherwise.

In one configuration, the data ports 18 may be coupled to the driver stage 10, the analog-to-digital converter 14, the secondary analog-to-digital converter 105 and the switching circuit 107 of the energy source 109, and the vehicle data bus (not shown).

The driver stage 10 may be coupled to the data port 18 such that the data processing system 16 can generate a command or outgoing signal to disable or enable the biasing circuit or driver stage 10; hence, control the disabling or enabling of the inverter (power stage 209) to prevent damage to the non-faulty inverter circuitry or the load (e.g., motor). The switching circuit 107 is coupled to the data port 18 such that the data processing system 16 can control the switch states of the switching circuit 107 to provide a target voltage level on the direct current bus 98 to perform tests on the power stage at test voltage range or lower voltage range or to otherwise control the first voltage level and the second voltage level on the direct current bus 98 to prevent damage to the power stage 209, the machine 177, or both.

The analog-to digital converter 14 facilitates the input or receipt of measured digital count data 115 or measured voltage data at measurement nodes via the analog interface 12. The secondary analog-to-digital converter 14 facilitates the input or receipt of measured direct current bus level data 117 (or direct current bus logic levels) from the voltage level detector 103.

In one embodiment, the data storage device 24 stores one or more of the following measured data, reference data or other data records: (1) diagnostic data 26 (e.g., one or more charts disclosed in this document that are formatted as look-up tables), (2) data records, files, charts or data structures derived from those tables set forth in this document, (3) a fault classifier 113 software or program instructions, (4) measured analog-to-digital converter (ADC) count data, (5) measured digital count data 115, (6) measured voltages or average voltages at corresponding measurement nodes with respect to negative ground potential or the negative terminal 99, (7) measured direct current bus 98 voltage level, (8) measured logic level for direct current bus 98, (9) DC bus level data 117, and (10) reference switching state for corresponding semiconductor devices (e.g., switching transistors or protective diodes) in the power stage 209.

In one embodiment, a voltage level detector 103 detects a voltage level of the direct current bus 98. A secondary analog-to-digital converter converts the determined voltage level to a logic level or dc bus level data 117 of the direct current bus 98. A fault classifier 113 classifies a fault of the inverter into a fault category based on: (a) the measured digital count data 115 meeting one or more reference ranges or states stored in a data storage device 24 for corresponding switch states of the semiconductor devices, and (b) the measured logic level or measured DC bus level 119 of direct current bus 98 meeting a corresponding logic level requirement for corresponding switch states of the semiconductor devices and corresponding reference ranges of digital count data 115. The digital count data 115 may comprise an analog-to-digital converter (ADC) count (of the analog-to-digital converter 14) or a digital representation of a voltage measured at a first measurement node for a first phase, a second measurement node for a second phase, or a third measurement node for a third phase. In alternate embodiments, the digital count data may represent another voltage, current or other electrical signal value at any measurement node.

If the analog-to-digital converter 14 is embodied as a delta-encoded, analog-to digital-converter, a counting analog-to-digital converter or a counter-ramp analog-to-digital converter, the analog-to-digital converter 14 may comprise a combination of an electronic counter, an electronic data processor 22 (e.g., microcontroller), and a comparator. For example, the counter has a digital counter output of digital count data 115 that corresponds to a value of an analog counter output signal. The analog counter output signal is inputted to one input of the comparator. The analog input signal (or reference signal to be digitized) is inputted to another input of the comparator. A data processor 22 or microcontroller increments or decrements the counter (or decremented) to achieve the target counter output when the comparator determines that the analog input signal and the analog counter output signal are substantially equal. The digital count data 115 is read or established by the electronic data processor 22 when the comparator determines that the analog input signal and the analog counter output signal are substantially equal. The comparator may be used to generate a logic signal input to the data processor 22 or microcontroller when the analog input signal and the counter output signal are equal to trigger reading of the output value (e.g., digital count data 115) of the counter.

Although a counting analog-to-digital converter may be used for converter 14 to practice the system and invention disclosed in this document, other analog-to-digital converters may be used to practice the invention and fall within the scope of the claims appended to this document. Accordingly, it is understood to one of ordinary skill in the art that value of ADC counts set forth in any of the charts (disclosed herein) may be replaced by corresponding digital voltage values, equivalent digital voltage values, or digital current values.

The system of FIG. 1 can detect faults in the inverter in accordance with various examples, which may be applied alternately or cumulatively.

In accordance with a first example, in any inverter phase (208, 206, 204) the pair of semiconductor devices comprises a first switching transistor (70, 56, 42) and a corresponding second switching transistor (78, 64, 50) within that phase of the power stage 209, and wherein the first switching transistor of the certain phase is determined to have failed in an open state if: (a) digital count data 115 for the first switching transistor (e.g., 70) is the same when the first switching transistor is commanded to achieve an active state and when the pair of transistors (e.g., 70 and 78) of the same phase is not commanded or is commanded to achieve an inactive state, and (b) the direct current bus 98 has a logic high state as the measured dc bus level data 117.

In accordance with a second example, a second protective diode (80, 66, 52) is connected between switched terminals (e.g., collector and emitter, or drain and source) of one of the semiconductor devices (78, 64, 50); the second protective diode (80, 66, 52) is determined to have failed in an open state if: (a) the digital count data 115 or voltage data at a first measurement node 310 for the first inverter phase 208 remains substantially the same with none of the switches commanded and upon opening the first switching transistor 70 of the first phase 208 and the second switching transistor 64 of the second phase 206; (b) the digital count data 115 remains substantially the same in a first state at a first measurement node 308 as a second state at a second measurement node 306 for the second phase 206, where the first state comprises the first switching transistor 70 of the first phase 208 and the second switching transistor 64 of the second phase 206 both being closed, and where the second state comprises the first switching transistor 70 and the second switching transistor 64 both being opened; (c) the digital count data 115 at the first measurement node 308 for the first phase 208 is greater than the digital count data 115 at the second measurement node 306 for the second phase 206 in the first state, and (d) the digital count data 115 at the first measurement node 308 for the first phase 208 differs from the digital count data 115 at the second measurement node 306 for the second phase 206 in the second state.

In accordance with a third example, a first protective diode (72, 58, 44) is connected between switched terminals (collector and emitter, or drain and source) of one of the semiconductor devices, the first protective diode 72 is determined to have failed in an open state if: (a) the digital count data 115 at a first measurement node 308 for the first phase 208 remains substantially the same when with none of the switches commanded and upon opening the first switching transistor (56) of the second phase 206 and the second switching transistor 78 of the first phase 208; (b) the digital count data 115 remains substantially the same in a first state at a first measurement node 308 as a second state at a second measurement node 306 for the second phase 206, where the first state comprises the first switching transistor 56 of the second phase 206 and the second switching transistor 78 of the first phase 208 both being closed, and where the second state comprises the first switching transistor 56 and the second switching transistor 78 both being opened; (c) the digital count data 115 at the first measurement node 308 for the first phase 208 is lower than the digital count data 115 at the second measurement node 306 for the second phase 206 in the first state, and (d) the digital count data 115 at the first measurement node 308 for the first phase 208 differs from the digital count data 115 at the second measurement node 306 for the second phase 206 in the second state.

In accordance with a fourth example, in one configuration, a voltage level detector 103 detects a voltage level or DC bus status of the direct current bus 98. A data processor 22 measures a rate of collapse of the voltage level of the direct current bus 98 when different semiconductor devices in the power stage 209 are in certain respective switch states. A fault classifier 113 or data processor 22 comprises software instructions to identify a faulty semiconductor device among the pair of the semiconductor devices in any phase (208, 206, 204) based on a differential measured rate of collapse. For example, if the semiconductor devices comprise a first switching transistor (70, 56, 42) and a second switching transistor (78, 64, 50) and if the direct current of the direct current bus 98 collapses faster with a command to a second switching transistor than with the first switching transistor of a particular phase, the first switching transistor is determined to have failed in a short state for that particular phase of the power stage 209.

The system of FIG. 1 is capable of detecting a short circuit associated with the direct current bus 98 under a wide variety of illustrative examples consistent with the following charts.

TABLE 1

| Case 1 - all switches are intact and poly-phase AC machine is appropriately connected with inverter | | | | | | | | |
|---|---|---|---|---|---|---|---|---|
| Switch condition in 3- | ADC count for V_pole_A | | ADC count for V_pole_B | | ADC count for V_pole_C | | ADC count for V_pole_BC | |
| ph inverter with brake chopper | 10 bit ADC | 12 bit ADC | 10 bit ADC | 12 bit ADC | 10 bit ADC | 12 bit ADC | 10 bit ADC | 12 bit ADC |
| None of switch commanded | 400 to 600 | 1500 to 2500 | 400 to 600 | 1500 to 2500 | 400 to 600 | 1500 to 2500 | 400 to 600 | 1500 to 2500 |
| Close A− IGBT | <250 | <850 | <250 | <850 | <250 | <850 | 400 to 600 | 1500 to 2500 |
| Close B− IGBT | <250 | <850 | <250 | <850 | <250 | <850 | 400 to 600 | 1500 to 2500 |
| Close C− IGBT | <250 | <850 | <250 | <850 | <250 | <850 | 400 to 600 | 1500 to 2500 |
| Close BC IGBT | 400 to 600 | 1500 to 2500 | 400 to 600 | 1500 to 2500 | 400 to 600 | 1500 to 2500 | <250 | <850 |
| Close A+ IGBT | >800 | >3200 | >800 | >3200 | >800 | >3200 | 400 to 600 | 1500 to 2500 |
| Close B+ IGBT | >800 | >3200 | >800 | >3200 | >800 | >3200 | 400 to 600 | 1500 to 2500 |
| Close C+ IGBT | >800 | >3200 | >800 | >3200 | >800 | >3200 | 400 to 600 | 1500 to 2500 |

TABLE 2

| Case 2 - a failure exist in inverter fed AC electric machine, it could be either in inverter or in machine |||||||||||
| --- | --- | --- | --- | --- | --- | --- | --- | --- | --- | --- |
| Switch condition in 3-ph inverter | ADC count for V_pole_A || ADC count for V_pole_B || ADC count for V_pole_C || ADC count for V_pole_BC || | |
| with brake chopper | 10 bit ADC | 12 bit ADC | 10 bit ADC | 12 bit ADC | 10 bit ADC | 12 bit ADC | 10 bit ADC | 12 bit ADC | DC bus status | Fault Category |
| None of switches commanded | <250 | <850 | <250 | <850 | <250 | <850 | <250 | <850 | Logic low | A |
| Close A+ IGBT | <250 | <850 | <250 | <850 | <250 | <850 | <250 | <850 | Logic low | B |
| Close B+ IGBT | <250 | <850 | <250 | <850 | <250 | <850 | <250 | <850 | | |
| Close C+ IGBT | <250 | <850 | <250 | <850 | <250 | <850 | <250 | <850 | | |
| Close A- IGBT | <250 | <850 | <250 | <850 | <250 | <850 | <250 | <850 | | |
| Close B- IGBT | <250 | <850 | <250 | <850 | <250 | <850 | <250 | <850 | | |
| Close C- IGBT | <250 | <850 | <250 | <850 | <250 | <850 | <250 | <850 | | |
| None of switches commanded | 400 to 600 | 1500 to 2500 | 400 to 600 | 1500 to 2500 | 400 to 600 | 1500 to 2500 | 400 to 600 | 1500 to 2500 | Logic high | C Ph A HS IGBT open |
| Close A+ IGBT | 400 to 600 | 1500 to 2500 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic high | C Ph B HS IGBT open |
| Close B+ IGBT | 400 to 600 | 1500 to 2500 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic high | C Ph C HS IGBT open |
| Close C+ IGBT | 400 to 600 | 1500 to 2500 | 400 to 600 | 1500 to 2500 | 400 to 600 | 1500 to 2500 | 400 to 600 | 1500 to 2500 | | |
| None of switches commanded | >800 | >3200 | >800 | >3200 | >800 | >3200 | 400 to 600 | 1500 to 2500 | | D (i) If Vdc collapses faster with A- command, A+ IGBT is failed short (ii) If Vdc collapses faster with B- command, B+ IGBT is failed short (iii) If Vdc collapses faster with C- command, C+ IGBT is failed short |
| Close B- IGBT | <250 | <850 | <250 | <850 | <250 | <850 | 400 to 600 | 1500 to 2500 | | |
| Close C- IGBT | <250 | <850 | <250 | <850 | <250 | <850 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase A LS diode failed open |
| Close A+ and B- | >800 | >3200 | <250 | <850 | 400 to 600 | 1500 to 2500 | 400 to 600 | 1500 to 2500 | | |
| Open A+ and B- | 400 to 600 | 1500 to 2500 | >800 | >3200 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase B LS diode failed open |
| Close B+ and C- | 400 to 600 | 1500 to 2500 | >800 | >3200 | <250 | <850 | 400 to 600 | 1500 to 2500 | | |
| Open B+ and C- | 400 to 600 | 1500 to 2500 | 400 to 600 | 1500 to 2500 | >800 | >3200 | 400 to 600 | 1500 to 2500 | | |

TABLE 2-continued

| Switch condition | ADC count for V_pole_A | | ADC count for V_pole_B | | ADC count for V_pole_C | | ADC count for V_pole_BC | | DC bus status | Fault Category | |
|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E | Phase C LS diode failed open |
| Close C+ and A− | <250 | <850 | 400 to 600 | 1500 to 2500 | >800 | >3200 | 400 to 600 | 1500 to 2500 | | | |
| Open C+ and A− | >800 | >3200 | 400 to 600 | 1500 to 2500 | 400 to 600 | 1500 to 2500 | 400 to 600 | 1500 to 2500 | | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E | Phase A HS diode failed open |
| Close B+ and A− | <250 | <850 | >800 | >3200 | 400 to 600 | 1500 to 2500 | 400 to 600 | 1500 to 2500 | | | |
| Open B+ and A− | 400 to 600 | 1500 to 2500 | <250 | <850 | 400 to 600 | 1500 to 2500 | 400 to 600 | 1500 to 2500 | | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E | Phase B HS diode failed open |
| Close C+ and B− | 400 to 600 | 1500 to 2500 | <250 | <850 | >800 | >3200 | 400 to 600 | 1500 to 2500 | | | |
| | 400 to 600 | 1500 to 2500 | <250 | <850 | >800 | >3200 | 400 to 600 | 1500 to 2500 | | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E | Phase C HS Diode failed open |
| Close A+ and C− | >800 | >3200 | 400 to 600 | 1500 to 2500 | <250 | <850 | 400 to 600 | 1500 to 2500 | | | |
| Open A+ and C− | <250 | <850 | 400 to 600 | 1500 to 2500 | 400 to 600 | 1500 to 2500 | 400 to 600 | 1500 to 2500 | | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E | High-side diode in brake chopper IGBT module failed open |
| Close BC IGBT | 400 to 600 | 1500 to 2500 | 400 to 600 | 1500 to 2500 | 400 to 600 | 1500 to 2500 | >800 | >3200 | | | |
| Open BC IGBT | 400 to 600 | 1500 to 2500 | 400 to 600 | 1500 to 2500 | 400 to 600 | 1500 to 2500 | 400 to 600 | 1500 to 2500 | | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | C | Brake chopper IGBT failed open |
| Close BC IGBT | 400 to 600 | 1500 to 2500 | 400 to 600 | 1500 to 2500 | 400 to 600 | 1500 to 2500 | 400 to 600 | 1500 to 2500 | | | |

Case 2 - detecting failure in connection between inverter and AC machine

| Switch condition in 3-ph inverter with brake chopper | ADC count for V_pole_A | | ADC count for V_pole_B | | ADC count for V_pole_C | | ADC count for V_pole_BC | | DC bus status | Fault Category |
|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | G Phase B of electric machine is not connected with inverter |
| Close A+ | >800 | >3200 | 400 to 600 | 1500 to 2500 | >800 | >3200 | 400 to 600 | 1500 to 2500 | | |
| Close A− | <250 | <850 | 400 to 600 | 1500 to 2500 | <250 | <850 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | G Phase C of electric machine not connected with inverter |
| Close B+ | >800 | >3200 | >800 | >3200 | 400 to 600 | 1500 to 2500 | 400 to 600 | 1500 to 2500 | | |
| Close B− | <250 | <850 | <250 | <850 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | G Phase A of electric machine not connected with inverter |
| Close C+ | 400 to 600 | 1500 to 2500 | >800 | >3200 | >800 | >3200 | 400 to 600 | 1500 to 2500 | | |
| | 400 to 600 | 1500 to 2500 | <250 | <850 | <250 | <850 | 400 to 600 | 1500 to 2500 | | |

TABLE 3

Case 3 - all switches are intact and poly-phase SR machine is appropriately connected with inverter

| Switch condition in 3-ph SR inverter with brake chopper | ADC count for V_pole_A+ | | ADC count for V_pole_A- | | ADC count for V_pole_B+ | | ADC count for V_pole_B- | | ADC count for V_pole_C+ | | ADC count for V_pole_C- | | ADC count for V_pole_BC | |
|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC |
| None of switches commanded | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 |
| Close A+ IGBT | >800 | >3200 | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 |
| Close A- IGBT | <250 | <850 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 |
| Close B+ IGBT | 400 to 600 | 1500 to 2500 | 400 to 600 | 1500 to 2500 | >800 | >3200 | >800 | >3200 | 400 to 600 | 1500 to 2500 | 400 to 600 | 1500 to 2500 | 400 to 600 | 1500 to 2500 |
| Close B- IGBT | 400 to 600 | 1500 to 2500 | 400 to 600 | 1500 to 2500 | <250 | <850 | <250 | <850 | 400 to 600 | 1500 to 2500 | 400 to 600 | 1500 to 2500 | 400 to 600 | 1500 to 2500 |
| Close C+ IGBT | 400 to 600 | 1500 to 2500 | 400 to 600 | 1500 to 2500 | 400 to 600 | 1500 to 2500 | 400 to 600 | 1500 to 2500 | >800 | >3200 | >800 | >3200 | 400 to 600 | 1500 to 2500 |
| Close C- IGBT | 400 to 600 | 1500 to 2500 | 400 to 600 | 1500 to 2500 | 400 to 600 | 1500 to 2500 | 400 to 600 | 1500 to 2500 | <250 | <850 | <250 | <850 | 400 to 600 | 1500 to 2500 |
| Close BC IGBT | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | >800 | >3200 |

TABLE 4

Case 4 - detecting failure in DC bus

| Switch condition in 3-ph SR inverter with brake chopper | ADC count for V_pole_A+ | | ADC count for V_pole_A- | | ADC count for V_pole_B+ | | ADC count for V_pole_B- | | ADC count for V_pole_C+ | | ADC count for V_pole_C- | | ADC count for V_pole_BC | | DC bus status | Fault Category |
|---|---|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | | |
| None of switches commanded | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | No fault |
| None of switches commanded | <250 | <850 | <250 | <850 | <250 | <850 | <250 | <850 | <250 | <850 | <250 | <850 | <250 | <850 | Logic Low | A DC bus failed short |
| Close A+ Close C+ Close C- Close BC | <250 | <850 | <250 | <850 | <250 | <850 | <250 | <850 | <250 | <850 | <250 | <850 | <250 | <850 | | Possible A & B short/open |
| | <250 | <850 | <250 | <850 | <250 | <850 | <250 | <850 | <250 | >850 | <250 | <850 | <250 | >850 | | |
| | <250 | <850 | <250 | <850 | <250 | <850 | <250 | <850 | <250 | <850 | <250 | <850 | <250 | <850 | | |
| | <250 | <850 | <250 | <850 | <250 | <850 | <250 | <850 | <250 | <850 | <250 | <850 | <250 | <850 | | |

TABLE 5

Case 4 - detecting failure in Phase A both machine and inverter with passed DC as stated in Table 4

| Switch condition in 3-ph SR inverter with brake chopper | ADC count for V_pole_A+ | | ADC count for V_pole_A- | | ADC count for V_pole_B+ | | ADC count for V_pole_B- | | ADC count for V_pole_C+ | | ADC count for V_pole_C- | | ADC count for V_pole_BC | | DC bus status | Fault Category |
|---|---|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | | |
| None of switches commanded | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | No fault in DC bus |

TABLE 5-continued

Case 4 - detecting failure in Phase A both machine and inverter with passed DC as stated in Table 4

| Switch condition in 3-ph SR inverter with brake chopper | ADC count for V_pole_A+ | | ADC count for V_pole_A− | | ADC count for V_pole_B+ | | ADC count for V_pole_B− | | ADC count for V_pole_C+ | | ADC count for V_pole_C+ | | ADC count for V_pole_BC | | DC bus status | Fault Category |
|---|---|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | | |
| None of switches commanded | <250 | <850 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | D and F Phase A LS IGBT failed short Or Phase A LS diode failed short |
| None of switches commanded | >800 | >3200 | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | D and F Phase A HS IGBT failed short Or Phase A HS diode failed short |
| Close A+ IGBT | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | C Phase A HS IGBT failed open |
| Close A− IGBT | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | C Phase A LS IGBT failed open |
| Close A+ and A− IGBTs | >800 | >3200 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | E Phase A HS diode failed open |
| Open A+ and keep A− closed | <250 | <850 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |
| Keep A+ open and open A− | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |
| Close A+ and A− IGBTs | >800 | >3200 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | E Phase A LS diode failed open |
| Keep A+ closed and open A− | >800 | >3200 | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |
| Open A+ and keep A− open | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |
| Close A+ | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | G Machine is not connected to pole point A+ |
| Close A− | 400 to 600 | 1500 to 2500 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | G Machine is not connected to pole point A− |

Any of Tables 1 through 5, inclusive, may be structured as one or more look-up tables, files, database, data records or other data structures that are stored as diagnostic data 26 in the data storage device 24 of the data processing system 16. In any of the Tables, there are two illustrative possibilities or permutations of ADC count depending upon when switches (IGBTs in inverter) are commanded close and/or open. The above possibilities are stated in Table below for 10-bit or 12 bit analog to digital converter (ADC) (e.g., analog-to digital converter 14). In Tables 1 through 5, inclusive, by sensing alternating current node voltages (inverter midpoint voltage with respect negative direct current bus) and knowing ADC counts for, V_pole_A, V_pole_B, V_pole_C, and V_pole_BC following failures can be detected in the inverter fed electric machine systems: (1) any or pair of switching transistors (e.g., IGBTs) failed short in the inverter; (2) any switching transistor (e.g., IGBT) failed open in the inverter; (3) any diode (e.g., protective diode) failed short or failed open in the inverter; (4) any capacitor failed short; (5) any cable between inverter or machine failed short or failed open; (6) any machine winding failed short or failed open; (7) any braking circuit transistor (e.g., brake chopper IGBT) or diode failed open or failed short; and (8) brake grid resistance and/or cable failed open or failed short.

Figure 2:
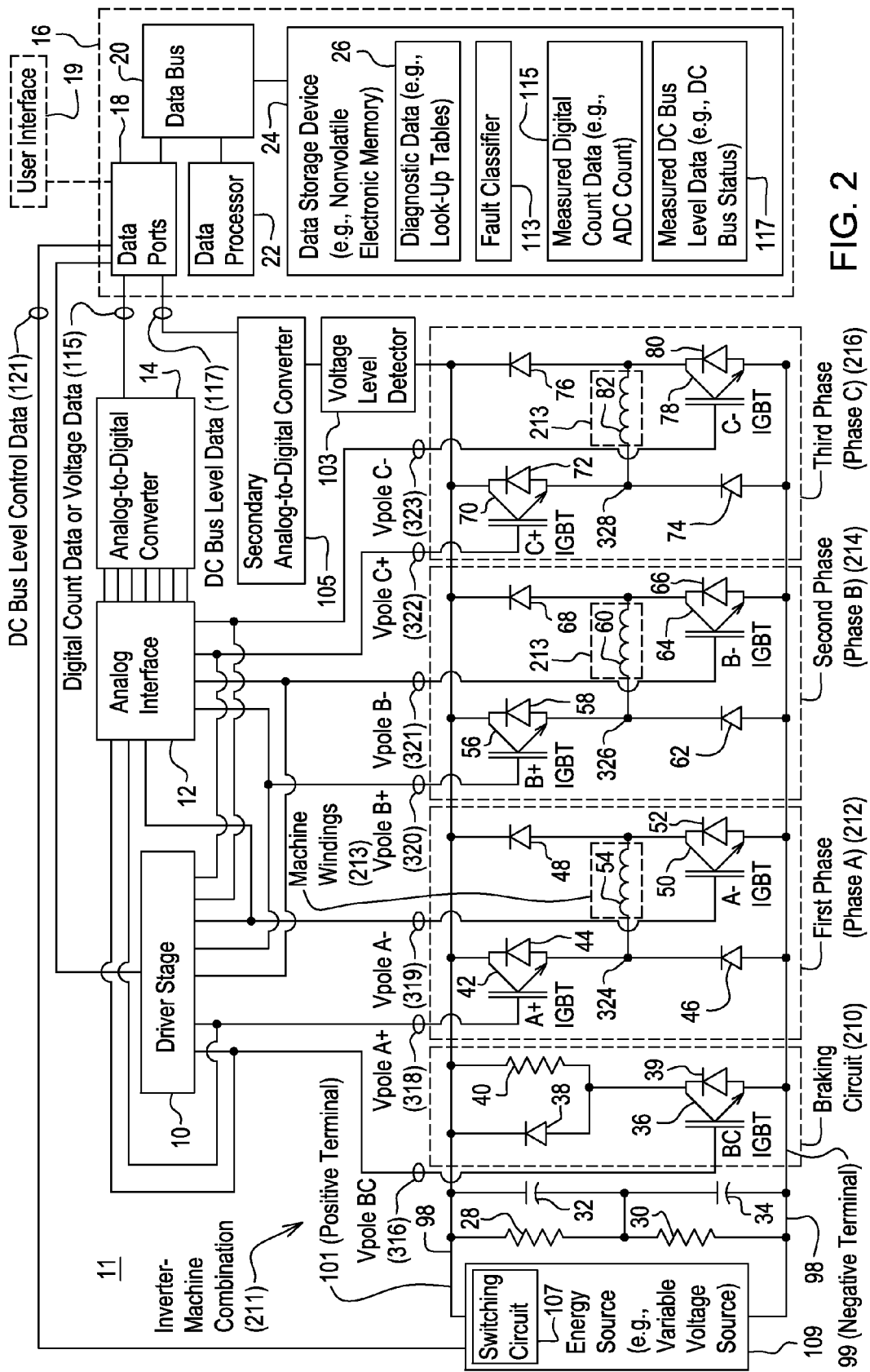
FIG. 2 is a block diagram of another embodiment of a system for detecting or diagnosing a failure associated with an inverter or a machine associated with the inverter.

In certain configurations, Tables 1 and 2 may apply to the system of FIG. 1 and FIG. 2, or to the diagnostics of a fault in an inverter or an associated a permanent magnet machine, an induction machine, or switched reluctance machine. Table 2 can be applied to the detection of failures associated with braking circuit (210 or 202) or its switching transistor (e.g., chopper IGBT).

In any of Tables 2 through 5, inclusive, if the ADC count does not follow the pattern stated above in Table 1, a fault can be declared in inverter, alternating current machines (e.g., induction and permanent magnets). These faults or failures of the inverter, the motor, or other associated components may be placed in following categories: (1) Category A: DC bus failed short, (2) Category B: DC bus failed open, (3) Category C: an IGBT failed open, (4) Category D: an IGBT failed short, (5) Category E: a diode failed open, (6) Category F: a diode failed short, and (7) Category G: motor cable is not connected with inverter pole.

Table 3 states the conditions or respective states for V_pole_A+, V_pole_A−, V_pole_B+, V_pole_B−, V_pole_C+, V_pole_C−, and V_pole_BC in FIG. 2 the polyphase switched reluctance (SR) machine is connected with the inverter of FIG. 2 to form the inverter machine combination 211, for example.

Table 4 is for detecting a failure associated with the direct current bus 98 of the switched reluctance system configuration of FIG. 2, for instance.

Table 5 is for detecting a failure associated with the direct current bus 98 of the switched reluctance system configuration of FIG. 2, for instance. Table 5 can be extended from the first phase (e.g. phase A) to the second phase (e.g., phase B) and the third phase (e.g., phase C) because the circuits of FIG. 1 and FIG. 2 are similar for phases A, B and C. For the second and third phases, the failure detection method stated in Table 5 will use switching transistors and diodes (e.g., IGBT's and diodes) for phases B and C, respectively to get appropriate pole voltages or ADC counts.

With respect to Table 5, first, if DC bus 98 has passed voltage measurement tests that indicate no short circuits on the direct current bus 98 and there is no other detectable failure, secondly, the data processing system 16 or fault classifier 113 may comprise program instructions to proceed with detecting failure in the inverter, its associated machine (e.g., motor) and the cable that connects machine with inverter.

In one configuration, the electronic processing system 16 is capable of disabling operation of the inverter in an operational mode at the operational voltage level if certain conditions are satisfied that indicate a short circuit or failure of a semiconductor device. In another configuration, in a test mode the data processing system 16 generates test signals to instruct the biasing circuit or driver 10 to selectively activate the first switching transistor or the second switching transistor of the first inverter phase 208, the second inverter phase 206, or the third inverter phase 204 such that a short circuit can be identified within the switching section or phase of the inverter power stage 209.

In an alternate embodiment, the user interface 19 (not show) may be coupled to the data bus 20. The user interface 19 may comprise a display, a keypad, a keyboard, a pointing device, or another data input and data output device for entering or monitoring data (e.g., diagnostic data 26) associated with the inverter via the data processing system 16.

In another configuration, the electronic data processing system 16 has a user interface 19 (not shown) coupled to the data bus 20 for providing diagnostic information indicative of the location or identity of a faulty semiconductor device or short circuit in the inverter.

The system 11 of FIG. 2 is similar to the system 111 of FIG. 1, except the system 11 of FIG. 2 has a different inverter (e.g., inverter-machine combination 211) that is applicable to a switched reluctance machine or motor, for example. Like reference numbers in FIG. 1 and FIG. 2 indicate like elements or features. Note that the reference numbers of the first switching transistors and the second switching transistors in FIG. 1 and FIG. 2 do not correspond to the same phases of the respective inverters, but that the first switching transistors are assigned reference numbers 42, 56, and 70 and the second switching transistors are assigned reference numbers 50, 64 and 78 in both FIG. 1 and FIG. 2.

The system 111 of FIG. 1 is well suited for a machine 177 that comprises a permanent magnet machine or motor, or an induction motor or machine, for example. In contrast, the system 11 of FIG. 2 primarily applies to a switched reluctance machine or motor. Each phase (216, 214, 212) of the inverter of FIG. 2 has an intermediate machine winding 213 between the pair of semiconductors (e.g., 70 and 78, 56 and 64, and 42 and 50), or referenced in conjunction with FIG. 1. If any first switching transistor and any second switching transistor of the same phase are regarded as coupled in series, then the intervening motor winding can be connected directly between the emitter of the first switching transistor (e.g., 70 for the third phase 216) and the collector of the second switching transistor (e.g., 78 of the third phase 216).

Each phase (212, 214, 216) of the inverter-machine combination 211 of FIG. 2 has set of diodes (48 and 46, 68 and 62, or 74 and 76) that are associated with the pair of semiconductor devices (42 and 50, 56 and 64, and 70 and 78). The anode (positive terminal) of a first diode (46, 62, and 74) of the set is coupled to the emitter of a first switching transistor (42, 56, and 70) and a first terminal of a winding 213 of the motor or machine (e.g., switched reluctance machine). The cathode (negative electrode) of the second diode (48, 68, 76) is coupled to the collector of a second switching transistor (50, 64, 78) and a second terminal of a winding 213 of the motor or machine (e.g., switched reluctance machine).

The machine winding 213 is connected between the semiconductor devices (e.g., 42 and 50, 56 and 64 or 70 and 78) within any phase (212, 214, 216), where the winding 213 has a first terminal and a second terminal. A first diode (46, 62, and 74) has its cathode coupled the negative terminal 99 and its anode coupled to the first terminal of the winding 213. A second diode (48, 68, 76) has its cathode coupled to the second terminal of the winding 213 and its anode coupled to the positive terminal 101 of the direct current bus 98.

In a first phase 212, the inverter (e.g., inverter machine combination 211) has set of diodes (46, 48) that are associated with the pair of semiconductor devices. The anode (positive terminal 101) of a first diode of the set is coupled to the emitter of a first switching transistor and a first terminal of a first winding 54 of the motor. The cathode (negative electrode) of the second diode is coupled to the collector of a second switching transistor and a second terminal of a first winding of the motor. A first output node 324 of the first phase 212 is connected to the machine winding 213.

In a second phase 214, the inverter has set of diodes (62 and 68) that are associated with the pair of semiconductor devices (56 and 64). The anode (positive terminal) of a first diode 62 of the set is coupled to the emitter of a first switching transistor 56 and a first terminal of a second winding 60 of the motor or machine. The cathode (negative electrode) of the second diode 68 is coupled to the collector of a second switching transistor 64 and a second terminal of a second winding 213 of the motor or machine. A second output node 326 of the second phase 214 is connected to the machine winding 213.

In a third phase 216, the inverter has set of diodes (74, 76) that are associated with the pair of semiconductor devices (70, 78). The anode (positive terminal 101) of a first diode 74 of the set is coupled to the emitter of a first switching transistor 70 and a first terminal of a third winding 82 of the motor or machine. The cathode (negative electrode) of the second diode 76 is coupled to the collector of a second switching transistor 78 and a second terminal of a third winding 82 of the motor or machine. A third output node 326 of the second phase 214 is connected to the machine winding 213.

In one embodiment, the addition of the sets of diodes (46, 48, 68, 62, 76, 74) provides greater current handling capacity or improved current management for the load or motor (e.g., switched reluctance load) than the pair of semiconductor devices alone within any phase of the inverter.

The above charts apply equally to the system FIG. 1 and FIG. 2. The system and associated method are well-suited for real-time detection of faults in the inverter, motor, or associated wiring, harnesses, cables, electronics or electrical components. In one embodiment, any of the following components of FIG. 1 or FIG. 2 can be implemented on a programmable system-on-chip (PSoC) architecture or other onboard intelligent system, for example: the driver stage 10, the analog interface 12, analog-to-digital converter 14, secondary analog-to-digital converter 105, and voltage level detector 103, and the data processing system 16. Because the design can be implemented readily on a programmable system on chip architecture or programming of the existing data processing system 16, the system may be more cost effective than other technical solutions that might require additional sensors, supplemental discrete components or external electronic systems.

In one configuration, the system compares the state of digital voltages associated with correspondingly applied gate signals by the driver stage 10 for low-side transistors (e.g., IGBT's). If compared signals don't agree with the desired V_pole and equivalent ADC counts, a fault and its location is declared and registered in the data processing system 16 (e.g., field programmable gate array (FPGA) and digital signal processor (DSP). Thereafter, system should be ready to mitigate or eliminate ill effects of occurred fault(s).

The system disclosed in this document facilitates real-time and pre-power diagnosis procedure will prevent cascading and catastrophic failures in the system. For example, during a test mode pre-power diagnosis at low voltage detects incipient failures before system is powered. In the test mode, the data processing system 16 supports a self diagnostics procedure that could automatically detect failures waiting to happen at high voltage during an operational mode of the inverter. The system is well suited for prognostics or predictive maintenance by application of procedures to track down failures that could eventually happen because gradual degradation and aging various vital parts in the inverter, machine or associated components. The system is well suited for performing real-time diagnostics procedure to detect failures (faults) under system in operation and mitigate or eliminate ill effects of these faults, while reducing the risk of catastrophic failure of the inverter, the motor, or associated components.

Having described the preferred embodiment, it will become apparent that various modifications can be made without departing from the scope of the invention as defined in the accompanying claims.

The following is claimed:

1. A system for detecting a fault associated with an inverter or a machine associated with the inverter, the system comprising:
   a direct current bus having a positive terminal and a negative terminal;
   an inverter comprising a first pair of semiconductor devices with switched terminals that are coupled in series between the positive terminal and the negative terminal of the direct current bus;
   an analog interface for adjusting a measured voltage level, at measurement nodes associated with base or gate control terminals of the semiconductor devices, to an adjusted voltage level;
   an analog-to-digital converter having analog inputs for receiving the adjusted voltage level of the measurement nodes and outputting corresponding digital count data; and
   a data processor for detecting the fault in the inverter if the digital count data does not conform to one or more reference ranges stored in a data storage device for corresponding switch states of the semiconductor devices, or for detecting the absence of fault in the inverter if the digital data count conforms to one or more reference ranges stored in the data storage device for corresponding switch states of the semiconductor devices.

2. The system according to claim 1 further comprising:
   a voltage level detector for detecting a voltage level of the direct current bus;
   a secondary analog to digital converter for converting the determined voltage level to a logic level of the direct current bus;
   a fault classifier for classifying a fault of the inverter into a fault category based on: (a) the measured digital count data meeting one or more reference ranges stored in a data storage device for corresponding switch states of the semiconductor devices, (b) the measured logic level of direct current bus meeting a corresponding logic level requirement for corresponding switch states of the semiconductor devices and corresponding reference ranges of digital count data.

3. The system according to claim 1 further comprising:
   a voltage level detector for detecting a voltage level of the direct current bus;
   a data processor measuring a rate of collapse of the voltage level when different semiconductor devices in certain respective switch states;
   identifying a faulty semiconductor device among the pair of the semiconductor devices based on a differential measured rate of collapse.

4. The system according to claim 1 wherein the semiconductor devices comprise a first switching transistor and a second switching transistor, if the direct current of the direct current bus collapses faster with a command to a second switching transistor than the first switching transistor is determined to have failed in a short state.

5. The system according to claim 1 further comprising:
   a winding of a motor, the winding connected between the semiconductor devices, the winding having a first terminal and a second terminal;

a first diode with its cathode coupled the negative terminal and its anode coupled to the first terminal of the winding; and a second diode with its cathode coupled to the second terminal of the winding and its anode coupled to the positive terminal of the direct current bus.

6. The system according to claim 1 wherein:
an energy source coupled to the direct current bus;
a switching circuit associated with the energy source for adjusting a voltage level on the direct current bus; and
the data processing system configured to control the switching circuit to adjust the voltage level on the direct current bus to a target voltage level.

7. The system according to claim 1 wherein the analog interface comprises an analog averaging circuit for determining an average voltage level on a measurement node.

8. The system according to claim 1 wherein for a certain phase the pair of semiconductor devices comprises a first switching transistor and a second switching transistor, and wherein the first switching transistor of the certain phase is determined to have failed in an open state if: (a) digital count data for the first switching transistor is the same when the first switching transistor is commanded to achieve an active state and when the pair of transistors is not commanded or is commanded to achieve an inactive state, and (b) the direct current bus has a logic high state.

9. The system according to claim 1 wherein for a certain phase a second protective diode is connected between switched terminals of one of the semiconductor devices, the second protective diode is determined to have failed in an open state if: (a) the digital count data at a first measurement node for the first phase remains substantially the same when with none of the switches commanded and upon opening the first switching transistor of the first phase and the second switching transistor of the second phase; (b) the digital count data remains substantially the same in a first state at a first measurement node as a second state at a second measurement node for the second phase, where the first state comprises the first switching transistor of the first phase and the second switching transistor of the second phase both being closed, and where the second state comprises the first switching transistor and the second switching transistor both being opened; (c) the digital count data at the first measurement node for the first phase is greater than the digital count data at the second measurement node for the second phase in the first state, and (d) the digital count data at the first measurement node for the first phase differs from the digital count data at the second measurement node for the second phase in the second state.

10. The system according to claim 1 wherein for a certain phase a first protective diode is connected between switched terminals of one of the semiconductor devices, the first protective diode is determined to have failed in an open state if: (a) the digital count data at a first measurement node for the first phase remains substantially the same when with none of the switches commanded and upon opening the first switching transistor of the second phase and the second switching transistor of the first phase; (b) the digital count data remains substantially the same in a first state at a first measurement node as a second state at a second measurement node for the second phase, where the first state comprises the first switching transistor of the second phase and the second switching transistor of the first phase both being closed, and where the second state comprises the first switching transistor and the second switching transistor both being opened; (c) the digital count data at the first measurement node for the first phase is lower than the digital count data at the second measurement node for the second phase in the first state, and (d) the digital count data at the first measurement node for the first phase differs from the digital count data at the second measurement node for the second phase in the second state.

11. A system for detecting a fault associated with an inverter or a machine associated with the inverter, the system comprising:
a direct current bus having a positive terminal and a negative terminal;
an inverter comprising a first pair of semiconductor devices with switched terminals that are coupled in series between the positive terminal and the negative terminal of the direct current bus;
an analog interface for adjusting a measured voltage level, at measurement nodes associated with base or gate control terminals of the semiconductor devices, to an adjusted voltage level;
an analog-to-digital converter having analog inputs for receiving the adjusted voltage level of the measurement nodes and outputting corresponding digital count data;
a voltage level detector for detecting a voltage level of the direct current bus;
a secondary analog-to-digital converter for converting the determined voltage level to a logic level of the direct current bus; and
a data processor for identifying and classifying a fault of the inverter into a fault category based on: (a) the measured digital count data meeting one or more reference ranges stored in a data storage device for corresponding switch states of the semiconductor devices, and (b) the measured logic level of direct current bus meeting a corresponding logic level requirement for corresponding switch states of the semiconductor devices and corresponding reference ranges of digital count data.

12. The system according to claim 11 further comprising:
a data processor measuring a rate of collapse of the voltage level when different semiconductor devices in certain respective switch states;
identifying a faulty semiconductor device among the pair of the semiconductor devices based on a differential measured rate of collapse.

13. The system according to claim 11 wherein the semiconductor devices comprise a first switching transistor and a second switching transistor, if the direct current of the direct current bus collapses faster with a command to a second switching transistor than the first switching transistor is determined to have failed in a short state.

14. The system according to claim 11 further comprising:
a winding of a motor, the winding connected between the semiconductor devices, the winding having a first terminal and a second terminal;
a first diode with its cathode coupled the negative terminal and its anode coupled to the first terminal of the winding; and
a second diode with its cathode coupled to the second terminal of the winding and its anode coupled to the positive terminal of the direct current bus.

15. The system according to claim 11 wherein:
an energy source coupled to the direct current bus;
a switching circuit associated with the energy source for adjusting a voltage level on the direct current bus; and
the data processing system configured to control the switching circuit to adjust the voltage level on the direct current bus to a target voltage level.

16. The system according to claim 11 wherein the analog interface comprises an analog averaging circuit for determining an average voltage level on a measurement node.

17. The system according to claim 11 wherein for a certain phase the pair of semiconductor devices comprises a first switching transistor and a second switching transistor, and wherein the first switching transistor of the certain phase is determined to have failed in an open state if: (a) digital count data for the first switching transistor is the same when the first switching transistor is commanded to achieve an active state and when the pair of transistors is not commanded or is commanded to achieve an inactive state, and (b) the direct current bus has a logic high state.

18. The system according to claim 11 wherein for a certain phase a second protective diode is connected between switched terminals of one of the semiconductor devices, the second protective diode is determined to have failed in an open state if: (a) the digital count data at a first measurement node for the first phase remains substantially the same when with none of the switches commanded and upon opening the first switching transistor of the first phase and the second switching transistor of the second phase; (b) the digital count data remains substantially the same in a first state at a first measurement node as a second state at a second measurement node for the second phase, where the first state comprises the first switching transistor of the first phase and the second switching transistor of the second phase both being closed, and where the second state comprises the first switching transistor and the second switching transistor both being opened; (c) the digital count data at the first measurement node for the first phase is greater than the digital count data at the second measurement node for the second phase in the first state, and (d) the digital count data at the first measurement node for the first phase differs from the digital count data at the second measurement node for the second phase in the second state.

19. The system according to claim 11 wherein for a certain phase a first protective diode is connected between switched terminals of one of the semiconductor devices, the first protective diode is determined to have failed in an open state if: (a) the digital count data at a first measurement node for the first phase remains substantially the same when with none of the switches commanded and upon opening the first switching transistor of the second phase and the second switching transistor of the first phase; (b) the digital count data remains substantially the same in a first state at a first measurement node as a second state at a second measurement node for the second phase, where the first state comprises the first switching transistor of the second phase and the second switching transistor of the first phase both being closed, and where the second state comprises the first switching transistor and the second switching transistor both being opened; (c) the digital count data at the first measurement node for the first phase is lower than the digital count data at the second measurement node for the second phase in the first state, and (d) the digital count data at the first measurement node for the first phase differs from the digital count data at the second measurement node for the second phase in the second state.

\* \* \* \* \*